(12) United States Patent
Nam et al.

(10) Patent No.: US 7,579,637 B2
(45) Date of Patent: Aug. 25, 2009

(54) IMAGE SENSING DEVICE FOR REDUCING PIXEL-TO-PIXEL CROSSTALK

(75) Inventors: Jung-Hyun Nam, Suwon-si (KR); Jong-Wan Jung, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 241 days.

(21) Appl. No.: 11/389,728

(22) Filed: Mar. 27, 2006

(65) Prior Publication Data

US 2006/0214249 A1 Sep. 28, 2006

(30) Foreign Application Priority Data

Mar. 28, 2005 (KR) ...................... 10-2005-0025482

(51) Int. Cl.
*H01L 31/00* (2006.01)
(52) U.S. Cl. .................. 257/292; 257/293; 257/461; 257/E31.081
(58) Field of Classification Search .............. 257/225, 257/233, 292, 294, 434, 461, 464
See application file for complete search history.

(56) References Cited

U.S. PATENT DOCUMENTS

| 5,751,032 | A | * | 5/1998 | Yu | 257/233 |
| 2001/0054726 | A1 | * | 12/2001 | Abe | 257/292 |
| 2004/0000681 | A1 | * | 1/2004 | Shinohara et al. | 257/290 |
| 2004/0222481 | A1 | * | 11/2004 | Rhodes | 257/435 |
| 2006/0244020 | A1 | * | 11/2006 | Lee | 257/291 |

FOREIGN PATENT DOCUMENTS

| CN | 1471311 | 1/2004 |
| JP | 11289076 | 10/1999 |
| KR | 10-2001-0061078 | 7/2001 |
| KR | 10-2004-0065332 | 7/2004 |

* cited by examiner

*Primary Examiner*—Marcos D. Pizzaro
*Assistant Examiner*—Tifney L Skyles
(74) *Attorney, Agent, or Firm*—F. Chau & Associates, LLC

(57) ABSTRACT

An image sensor and a method of fabricating the image sensor are provided. The image sensor includes a semiconductor substrate having a first conductivity type, a deep well having a second conductivity type. The deep well is formed at a predetermined depth in the semiconductor substrate to divide the semiconductor substrate into a first conductivity type upper substrate area and a lower substrate area. The image sensor further includes a plurality of unit pixels integrating charges corresponding to incident light and comprising first conductivity type ion-implantation areas. The first conductivity type ion-implantation areas are separated from one another. Moreover, at least one unit pixel among the plurality of unit pixels further comprises the first conductivity type upper substrate area that is positioned under a first conductivity type ion-implantation area included in the unit pixel. Further, the at least one unit pixel among the plurality of unit pixels extends beyond the first conductivity type ion-implantation area and is electrically isolated from first conductivity type ion-implantation areas included in adjacent unit pixels of the plurality of unit pixels.

14 Claims, 13 Drawing Sheets

IMAGE SENSING DEVICE FOR REDUCING PIXEL-TO-PIXEL CROSSTALK

This application claims priority from Korean Patent Application No. 10-2005-0025482 filed on Mar. 28, 2005 in the Korean Intellectual Property Office, the disclosure of which is incorporated by reference herein in its entirety.

BACKGROUND OF THE INVENTION

1. Field of the Invention

The present invention relates to an image sensor and to a method of fabricating the same, and more particularly, to an image sensor for reducing pixel-to-pixel crosstalk and a method of fabricating the same.

2. Description of the Related Art

An image sensor converts optical information into electrical signals. Recently, with the expansion of the computer and communication industries, there has also been an increasing demand for highly-efficient image sensors in various fields such as digital cameras, camcorders, personal communication systems, game devices, surveillance cameras, microcameras for medical use, robots, and so on.

A unit pixel in an image sensor converts incident light into an electrical signal, and integrates charges corresponding to the amount of light at a photoelectric converter. In addition, a unit pixel of an image sensor reproduces an image signal through a readout operation. However, the incident light may form charges that are not integrated at the photoelectric converter of the unit pixel. For example, in a charge coupled device (CCD), charges generated in lower and side portions of a photodiode may be injected into a vertical transmission CCD channel, causing what is known as a smear effect. In addition, in a CMOS image sensor, charges may be moved to and integrated at a photoelectric converter of an adjacent pixel, causing what is known as pixel-to-pixel crosstalk.

Referring to FIG. 1, pixel-to-pixel crosstalk may be divided into the following categories: (a) optical crosstalk A which occurs when a reflected light 6 and a refractive light are transmitted to a photoelectric converter 2 of a unit pixel adjacent to a relevant unit pixel, a reflected light 6 being formed by reflection on the top or side of metal wirings M1, M2, and M3, a refractive light being formed by refraction at a non-uniform layer or at a multilayer structure including interlayer insulating layers having different refractive indexes; and (b) electrical crosstalk B occurring when charges generated at the lower or side portion of the photoelectric converter 2 of the relevant unit pixel are delivered to the photoelectric converter 2 of an adjacent unit pixel via a long-wavelength incident light 7.

When crosstalk occurs, resolution decreases in a black and white image sensor, causing distortion in an image. In addition, in a color image sensor using an RGB color filter array (CFA), the probability of crosstalk occurring due to red light having a long wavelength is high, which may cause poor tint. Moreover, crosstalk may cause a blooming effect in which adjacent pixels blur on an image.

Thus, there is a need for an improved image sensor having reduced pixel-to-pixel crosstalk and for a method of fabricating the same.

SUMMARY OF THE INVENTION

According to an exemplary embodiment of the present invention, an image sensor is provided. The image sensor includes a semiconductor substrate having a first conductivity type and a deep well having a second conductivity type. The deep well is formed at a predetermined depth in the semiconductor substrate to divide the semiconductor substrate into a first conductivity type upper substrate area and a lower substrate area. The image sensor further includes a plurality of unit pixels integrating charges corresponding to incident light and including first conductivity type ion-implantation areas. The first conductivity ion-implantation areas are separated from one another. In addition, at least one unit pixel among the plurality of unit pixels further includes the first conductivity type upper substrate area that is positioned under a first conductivity type ion-implantation area included in the unit pixel. Also, the at least one unit pixel among the plurality of unit pixels extends beyond the first conductivity type ion-implantation area and is electrically isolated from first conductivity type ion-implantation areas included in adjacent unit pixels of the plurality of unit pixels.

According to another exemplary embodiment of the present invention, a method for fabricating an image sensor is provided. The method includes providing a semiconductor substrate having a first conductivity type, forming a deep well having a second conductivity type at a predetermined depth in the semiconductor substrate to divide the semiconductor substrate into a first conductivity type upper substrate area and a lower substrate area, and forming a plurality of unit pixels integrating charges corresponding to incident light and comprising first conductivity type ion-implantation areas. The first conductivity type ion-implantation areas are separated from one another such that at least one unit pixel among the plurality of unit pixels further comprises the first conductivity type upper substrate area that is positioned under a first conductivity type ion-implantation area included in the unit pixel Further, the at least one unit pixel among the plurality of unit pixels extends beyond the first conductivity type ion-implantation area and is electrically isolated from first conductivity type ion-implantation areas included in adjacent unit pixels of the plurality of unit pixels.

BRIEF DESCRIPTION OF THE DRAWINGS

The above and other features of the present invention will become more apparent by describing in detail preferred embodiments thereof with reference to the attached drawings in which.

DETAILED DESCRIPTION OF THE EXEMPLARY EMBODIMENTS OF THE INVENTION

Image sensors according to exemplary embodiments of the present invention include charge coupled device (CCD) image sensors, as well as complementary metal oxide semiconductor (CMOS) image sensors. The CDD image sensor has smaller noise and better image quality than the CMOS image sensor. However, the CCD image sensor requires a higher voltage and is more expensive to manufacture than a CMOS image sensor. In addition, the CMOS image sensor is easy to operate and can be implemented in various scanning methods. Moreover, since a signal processing circuit can be integrated with a CMOS image sensor on a single chip, smaller products can be produced as a result. In addition, the manufacturing costs can be reduced using a CMOS manufacturing technology. Further, due to its very low power consumption, the CMOS image sensor can be easily applied to products with limited battery capacity. Inlight of the foregoing, the exemplary embodiments of the present invention will be described with reference to a CMOS image sensor. However, the technical spirit of the present invention can also be applied to a CCD image sensor as well.

The exemplary embodiments of the present invention will now be described more fully with reference to the accompanying drawings, in which preferred embodiments of the invention are shown.

Exemplary embodiments of an image sensor of the present invention will be described with respect to FIGS. 2 through 10B.

Figure 1:
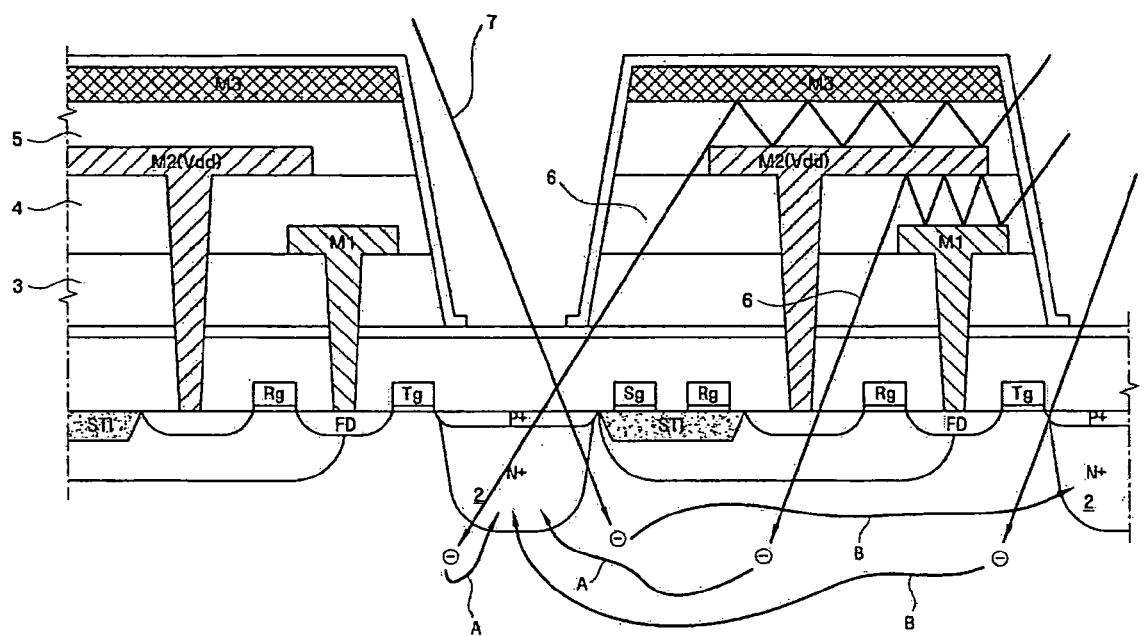
FIG. 1 illustrates a pixel array of a general image sensor.
Figure 2:
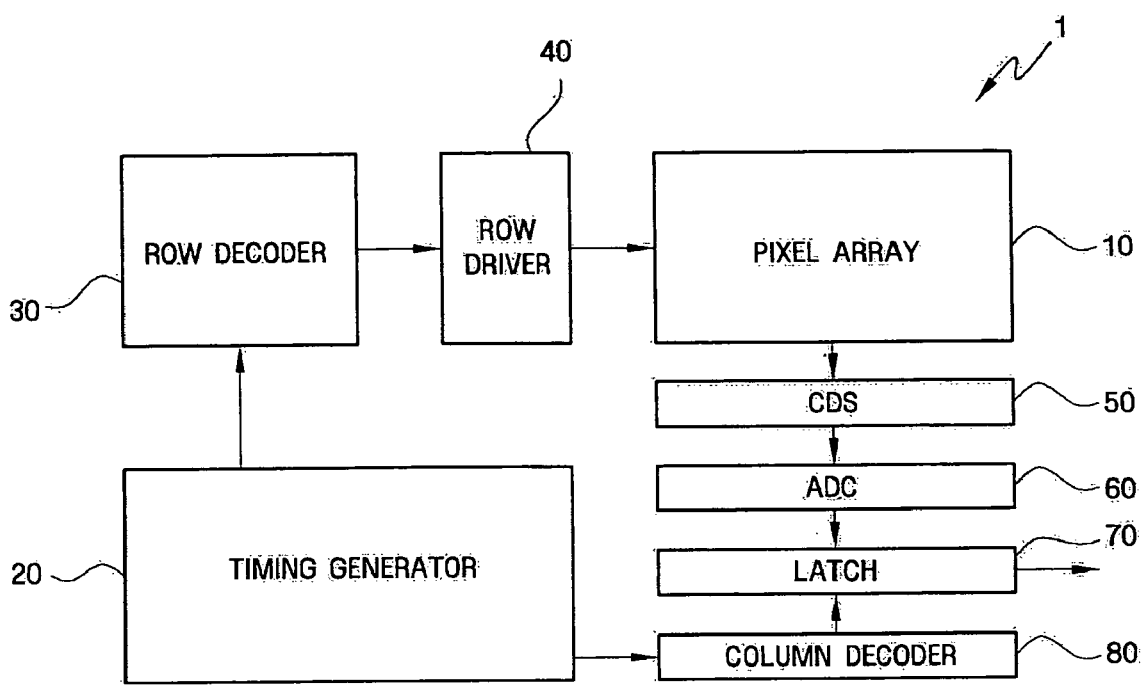
FIG. 2 is a block diagram of an image sensor according to an exemplary embodiment of the present invention.

FIG. 2 is a block diagram of an image sensor according to an exemplary embodiment of the present invention.

Referring to FIG. 2, an image sensor 1 includes a pixel array 10, a timing generator 20, a row decoder 30, a row driver 40, a correlated double sampler (CDS) 50, an analog-to-digital converter (ADC) 60, a latch 70, and a column decoder 80.

The pixel array 10 includes a plurality of unit pixels arranged in two dimensions. The plurality of unit pixels convert an optical image into an electrical signal. The pixel array 10 operates in response to a plurality of driving signals such as a pixel selection signal (ROW), a reset signal (RST), and first and second charge transmission signals (TG1 and TG2) received from the row driver 40. The pixel array 10 provides the electrical signal to the CDS 50 via a vertical signal line.

Figure 3:
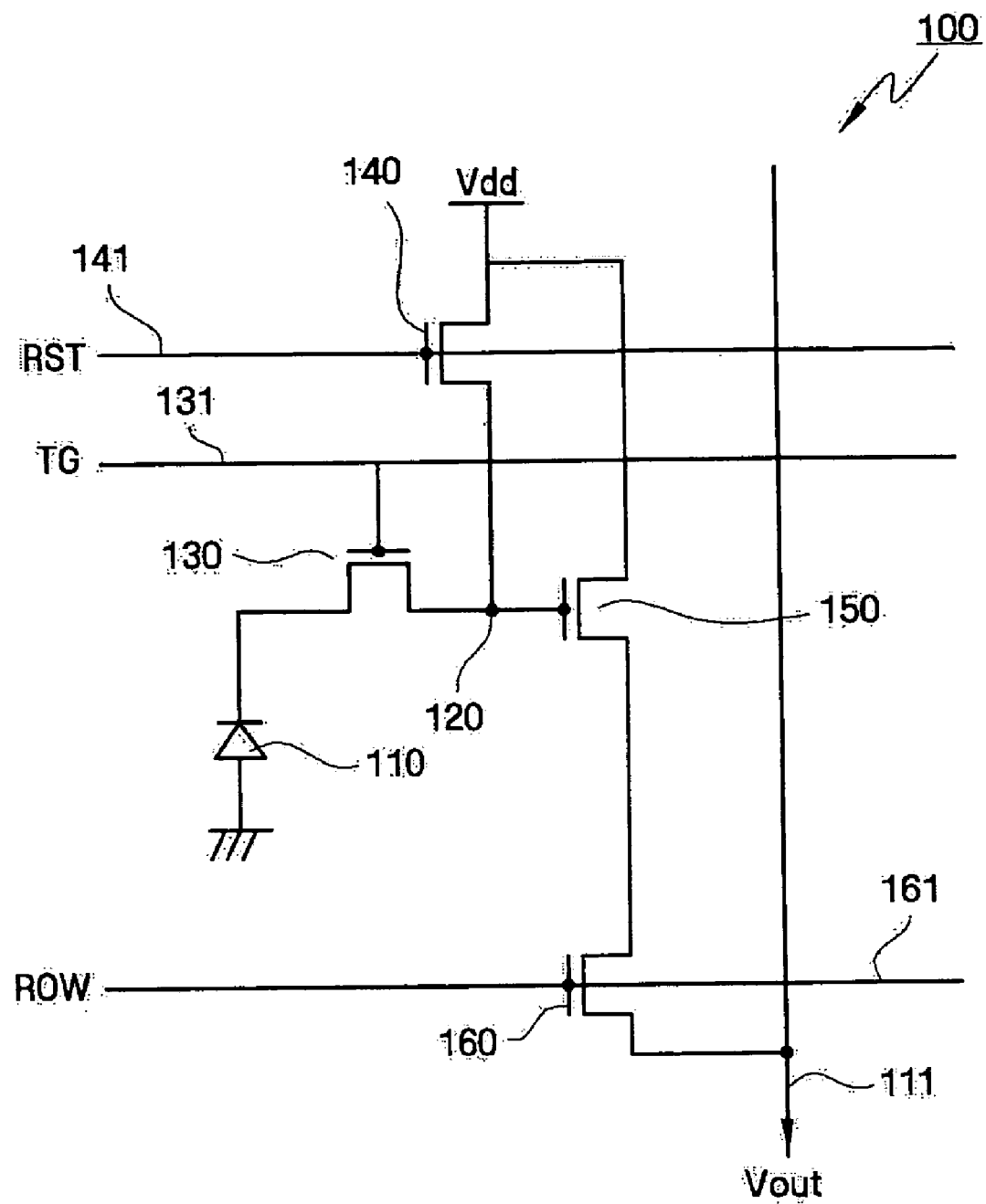
FIG. 3 is a circuit diagram of a unit pixel in an image sensor, according to an exemplary embodiment of the present invention.

Referring to FIG. 3, a unit pixel 100 includes a photoelectric converter 110, a charge detector 120, a charge transmitter 130, a reset unit 140, an amplifier 150, and a selector 160. The unit pixel 100 includes four transistors in an exemplary embodiment illustrated in FIG. 3 but may also include but is not limited to 3 or 5 transistors.

The photoelectric converter 110 absorbs incident light and integrates charges corresponding to the amount of incident light. The photoelectric converter 110 absorbs incident light and accumulates an amount of electric charge corresponding to the amount of incident light. Moreover, the photoelectric converter 110 may be a photodiode, a phototransistor, a photogate, a pinned photodiode (PPD), or a combination of any of these devices.

The charge detector 120 is implemented as a floating diffusion (FD) region and receives the integrated charges from the photoelectric converter 110. The charge detector 120 has parasitic capacitance and thus stores charge accumulatively. The charge detector 120 is electrically connected to a gate of the amplifier 150 and controls the amplifier 150.

The charge transmitter 130 transmits the charges from the photoelectric converter 110 to the charge detector 120. Generally, the first charge transmitter 130 is comprised of one transistor and is controlled by a charge transmission signal TG.

The reset unit 140 periodically resets the charge detector 120. A source of the reset unit 140 is connected to the charge detector 120, and a drain of the reset unit 140 is connected to the power supply voltage Vdd. The reset unit 140 operates in response to the reset signal RST.

The amplifier 150 combines with a constant current source positioned outside the unit pixel 100 and acts as a source follower buffer amplifier. A varying voltage which is responsive to a voltage of the charge detector 120 is output from the amplifier 150 to a vertical signal line 162. A source of the amplifier 150 is connected to a drain of the selector 160. In addition, a drain of the amplifier 150 is connected to the power supply voltage Vdd.

The selector 160 selects the unit pixel 100 to be read in row units. The selector 160 drives in response to a selection signal ROW and has a source connected to a vertical signal line 111.

In addition, driving signal lines 131, 141, and 161 of the respective charge transmitter 130, reset unit 140, and selector 160 extend in a row direction (i.e., a horizontal direction) so that unit pixels on the one row operate simultaneously.

Referring back to FIG. 2, the timing generator 20 provides a timing signal and a control signal to the row decoder 30 and the column decoder 80.

The row driver 40 provides a plurality of driving signals to the pixel array 10 to operate the plurality of unit pixels according to a decoding result of the row decoder 30. Generally, when the unit pixels are arranged in a matrix form, a driving signal is provided for each row.

The CDS 50 receives an electrical signal from the pixel array 10 via a vertical signal line and performs holding and sampling. That is, the CDS 50 double samples a reference voltage level (hereinafter, referred to as a "noise level") and a voltage level of the electrical signal (hereinafter, referred to as a "signal level") and outputs a differential level corresponding to the difference between the noise level and the signal level.

The ADC 60 converts an analog signal corresponding to a differential level into a digital signal.

The latch 70 latches the digital signal. The latched signal is sequentially output to an image signal processor according to a decoding result of the column decoder 80.

Figure 4:
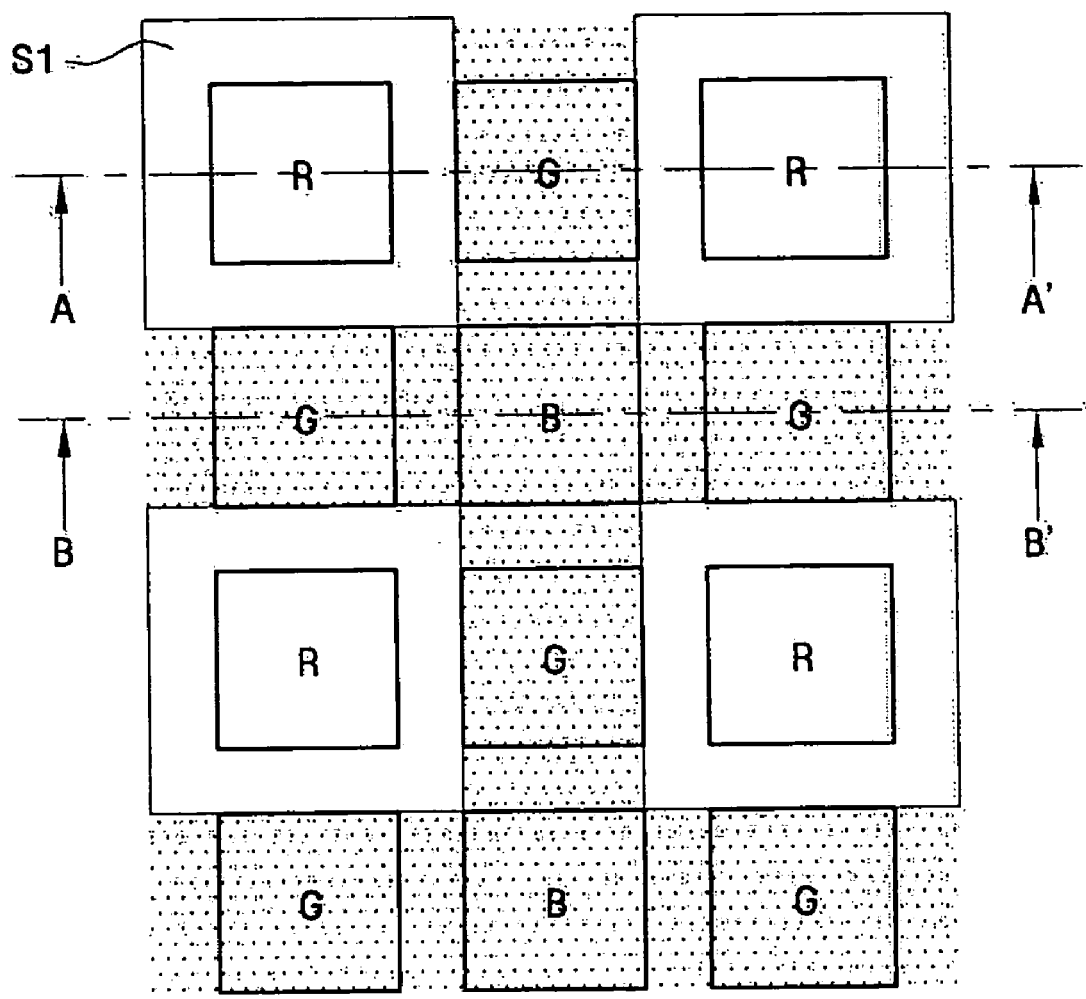
FIG. 4 is a layout illustrating the relationship between a photoelectric converter of a unit pixel and a second isolation well in an image sensor, according to an exemplary embodiment of the present invention.
Figure 5A:
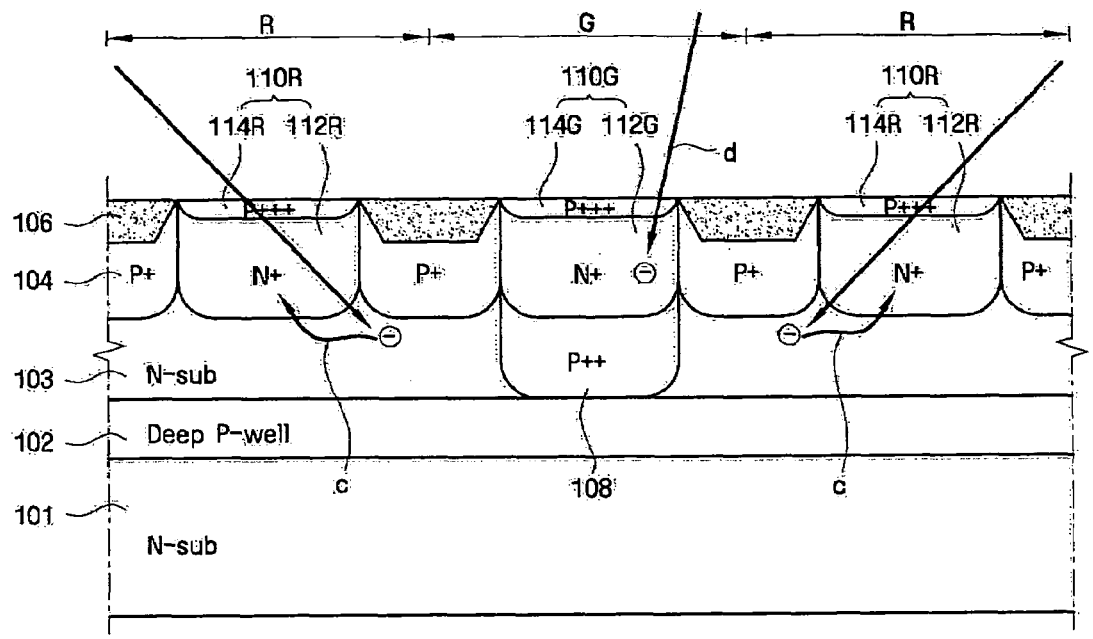
FIG. 5A is a cross-section of the image sensor, taken along the line A-A' shown in FIG. 4.
Figure 5B:
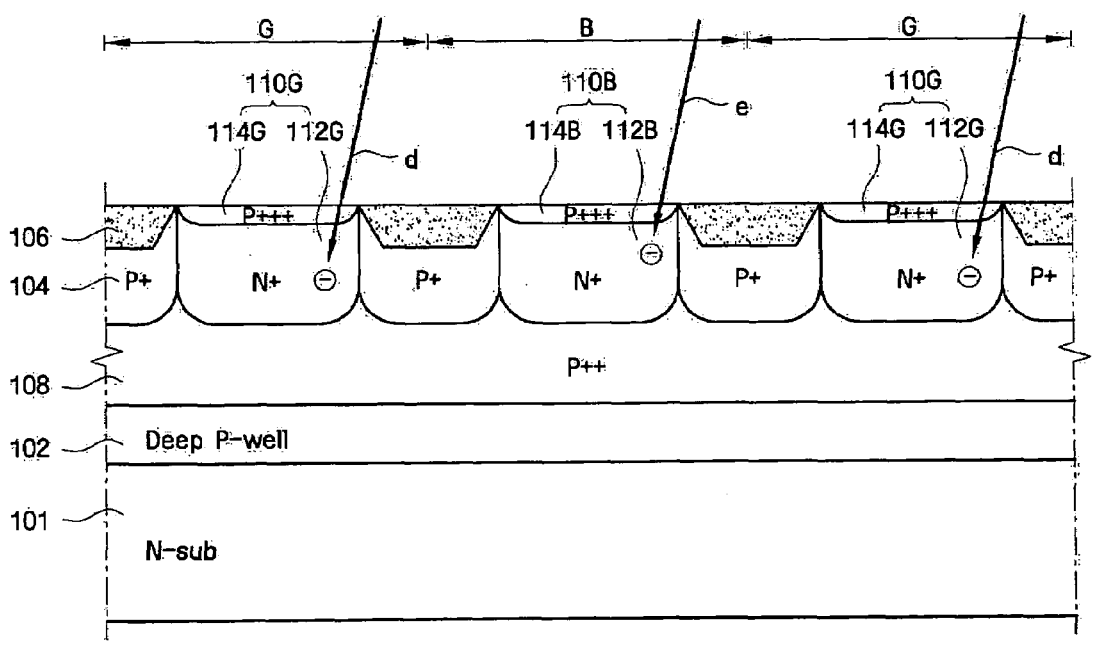
FIG. 5B is a cross-section of the image sensor, taken along the line B-B' shown in FIG. 4.

FIG. 4 is a layout illustrating the relationship between a photoelectric converter of a unit pixel and a second isolation well in an image sensor, according to an exemplary embodiment of the present invention, FIG. 5A is a cross-section of the image sensor, taken along the line A-A' shown in FIG. 4, and FIG. 5B is a cross-section of the image sensor, taken along the line B-B' shown in FIG. 4.

Referring to FIG. 4, an image sensor according to an exemplary embodiment of the present invention includes a plurality of unit pixels in a matrix form to convert an optical image into an electrical signal. Further, since incident light passes through a micro lens and a color filter and then reaches a photoelectric converter, charges corresponding to incident light in a predetermined wavelength range are integrated. In particular, in an exemplary embodiment of the present invention, color filters may be arranged in a Bayer type color filter array (CFA). However, the present invention is not restricted thereto. Preferably, half or more of a Bayer color filter array is provided for the color green due to the fact that human eyes are more sensitive to green than other colors.

Referring to FIGS. 4 through 5B, the image sensor includes a semiconductor substrate, a deep well 102, a first isolation well 104, a device isolation region 106, a second isolation well 108, and photoelectric converters 110R, 110G, and 110B. In the exemplary embodiment illustrated in FIGS. 4 through 5B, each of the photoelectric converters 110R, 110G, and 110B are implemented as a pinned photo diode (PPD).

The semiconductor substrate is a first conductivity type (for example, an N type) and includes a lower substrate area 101 and an upper substrate area 103. In detail, the lower and upper substrate areas 101 and 103 are defined by the second conductivity type (for example, P type) deep well 102 formed to a predetermined depth in the semiconductor substrate.

The deep well 102 forms a potential barrier so that charges generated deep in the lower substrate area 101 are prevented from flowing into the photoelectric converters 110R, 110G, and 110B to avoid a recombination between charges and holes. Consequently, the deep well 102 reduces pixel-to-pixel crosstalk caused by random drift of charges.

For example, the deep well 102 may have a maximum concentration at a depth of about 3-12 μm from a surface of the semiconductor substrate and may have a thickness of about 1-5 μm. Here, the depth of about 3-12 μm is substantially the same as an absorption length of red or near infrared region light. When the depth of the deep well 102 from the surface of the semiconductor substrate becomes shallow, the diffusion prevention effect increases, and therefore, crosstalk decreases. However, since the photoelectric converters 110R, 110G, and 110B also become shallow, sensitivity with respect to incident light having a long wavelength (e.g., a red wavelength) that has a high photoelectric conversion rate at a deep place may also decrease. Accordingly, the position of the deep well 102 may be adjusted according to a wavelength range of incident light.

The device isolation region 106 is formed in the upper substrate area 103 to define an active region. Generally, the device isolation region 106 may be a field oxide (FOX) or shallow trench isolation region formed using a local oxidation of silicon (LOCOS) method.

In addition, the second conductivity type (e.g., P+ type) first isolation well 104 may be formed under the device isolation region 106. The first isolation well 104 isolates a plurality of photodiodes 112R, 112G, and 112B from each other. To reduce horizontal crosstalk among the photodiodes 112R, 112G, and 112B, the first isolation well 104 extends to substantially the same depth as or deeper than the photodiodes 112R, 112G, and 112B.

The photoelectric converters 110R, 110G, and 110B include the N+ type photodiodes 112R, 112G, and 112B, respectively; P+++ type pinning layers 114R, 114G, and 114B, respectively; and the upper substrate area 103 positioned under the photodiodes 112R, 112G, and 112B.

The photodiodes 112R, 112G, and 112B store charges generated corresponding to incident light. The pinning layers 114R, 114G, and 114B reduce electron-hole pairs (EHPs) thermally generated in the upper substrate area 103, thereby preventing dark current. In other words, among EHPs thermally generated at a dangling bond on the surface of the upper substrate area 103, positive charges diffuse to a grounded substrate via the P+++ type pinning layers 114R, 114G, and 114B, and negative charges recombine with the positive charges during diffusion through the pinning layers 114R, 114G, and 114B and thus become extinct.

The photodiodes 112R, 112G, and 112B are separated from the deep well 102 by a predetermined distance, and therefore, the upper substrate area 103 positioned under the photodiodes 112R, 112G, and 112B can be used for photoelectric conversion. In detail, the photoelectric converters 110R, 110G, and 110B include the first conductivity type photodiodes 112R, 112G, and 112B, respectively, as well as the first conductivity type upper substrate area 103 which is positioned under the photodiodes 112R, 112G, and 112B. It is also noted that the area of the upper substrate area 103 changes in accordance with the particular wavelength of incident light. Here, when stating that the area of the upper substrate area 103 changes, this includes meaning that the upper substrate area 103 may in some other exemplary embodiments not be included in the photoelectric converters 110R, 110G, and 110B.

Referring to FIG. 5A, the upper substrate area 103 positioned under the photodiode 112R included in at least one photoelectric converter 110R among the plurality of the photoelectric converters 110R, 110G, and 110B extends beyond a range of the photodiode 112R and is electrically and/or physically isolated from the photodiode 112G of the adjacent photoelectric converter 110G. In particular, at least part of the upper substrate area 103 positioned under the photodiode 112R overlaps with the first isolation well 104. The upper substrate area 103 positioned under the photodiode 112R, extends beyond the range of the photodiode 112R and can integrate charges corresponding to incident light such as red-wavelength light having the longest wavelength of incident light to the photoelectric converters 110R, 110G, and 110B.

When the upper substrate area 103 positioned under the photodiodes 112R, 112G, and 112B integrates charges corresponding to incident light having a long wavelength, its area S1 increases. In other words, the upper substrate area 103 positioned under the photodiode 112R included in the photoelectric converter 110R, i.e., a red photoelectric converter corresponding to incident light having a red wavelength, extends to a portion under the first isolation well 104. Contrarily, photoelectric converters 110G and 110B, i.e., a green photoelectric converter and a blue photoelectric converter corresponding to green-wavelength light and blue-wavelength light, respectively, do not include the upper substrate area 103 but rather includes only the photodiodes 112G and 112B, respectively.

In detail, the photodiodes 112R, 112G, and 112B of the respective photoelectric converters 110R, 110G, and 110B are separated from one another by the first isolation well 104 and the upper substrate area 103 positioned under the photodiodes 112R, 112G, and 112B is divided by the second isolation well 108. The area of the second isolation well 108 increases when incident light has a short wavelength. In an exemplary embodiment of the present invention, the second isolation well 108 is not formed under the red photodiode 112R but rather is formed under the green and blue photodiodes 112G and 112B. In other words, as shown in FIG. 4, ion-implantation is performed on an area other than the red photoelectric converter 110R and its surrounding area, thereby forming the second isolation well 108.

Since a long wavelength in the red region has a great penetration depth in silicon, charges are easily generated in the upper substrate area 103, and therefore, crosstalk is highly likely to occur. In particular, even when charges are generated in the upper substrate area 103 due to light incident with a predetermined slope as shown in FIG. 5A, the charges can be integrated at the red photodiode 112R as illustrated by an arrow "c" since the upper substrate area 103 is wide. As a result, the sensitivity of the red photodiode 112R increases. Contrarily, since a wavelength in a green or blue region has a lesser penetration depth than a wavelength in the red region in silicon, the area of the upper substrate area 103 under the photodiodes 112G and 112B may be adjusted according to operational characteristics or fabrication conditions of the image sensor. When the second isolation well 108 is formed extending under the photodiodes 112G and 112B and the first isolation well 104 as shown in FIGS. 5A and 5B, externally generated charges are prevented from flowing into the photodiodes 112G and 112B and charges generated due to green-wavelength light and blue-wavelength light denoted by arrows "d" and "e", respectively, are integrated at the photodiodes 112G and 112B.

Meanwhile, the exemplary embodiment of the present invention described above significantly reduces the probability of crosstalk as compared to a case where a first isolation well is formed deep using high energy to isolate a plurality of photoelectric converters (i.e., the first isolation well separates photodiodes from one another and simultaneously divides an upper substrate area under the photodiodes). In detail, when all of red, green, and blue photoelectric converters have the upper substrate area as the same size under their photodiodes due to the first isolation well formed deep, photoelectric conversion may occur in the first isolation well due to incident light having a particular slope, and therefore, the probability of crosstalk still exists. In addition, in terms of fabrication, the thickness of photoresist increases to form the first isolation well deep, and therefore, it is difficult to form micro patterns. When the photoelectric converters 110R, 110G, and 110B and the second isolation well 108 are formed as shown in FIG. 4, fabrication can be performed easily since the pattern width is satisfactorily wide in a photo process.

Figure 6A:
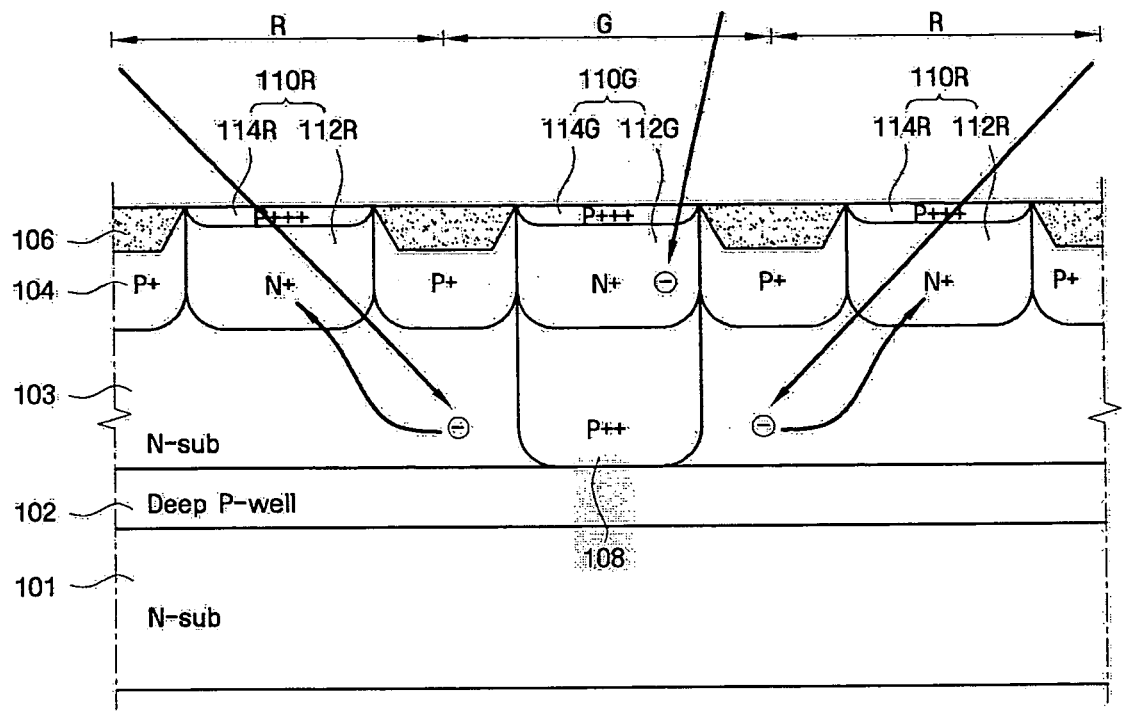
FIGS. 6A and 6B are cross-sections of an image sensor including a unit pixel, according to an exemplary embodiment of the present invention.
Figure 6B:
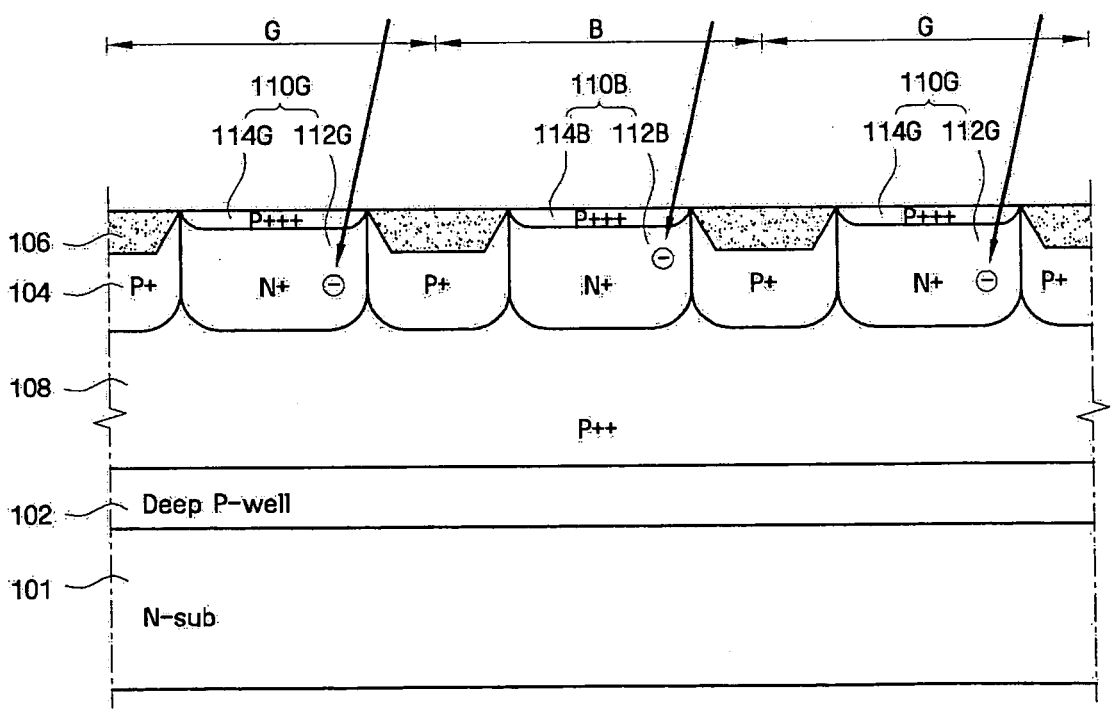

FIGS. 6A and 6B are cross-sections of an image sensor including a unit pixel, according to another exemplary embodiment of the present invention. For brevity, components each having the same function as described in the exemplary embodiment shown in FIGS. 5A and 5B are identified by the same reference numeral and a repetitive description thereof will be omitted.

An image sensor according to an exemplary embodiment illustrated in FIGS. 6A and 6B includes the upper substrate area 103 provided thicker than that included in the image sensor according to the exemplary embodiment illustrated in FIGS. 4 through 5B. Accordingly, in this exemplary embodiment, more charges generated in the upper substrate area 103 due to a long wavelength can be integrated and color sensitivity can be increased compared to the previous exemplary embodiment of FIGS. 4 through 5B.

Figure 7:
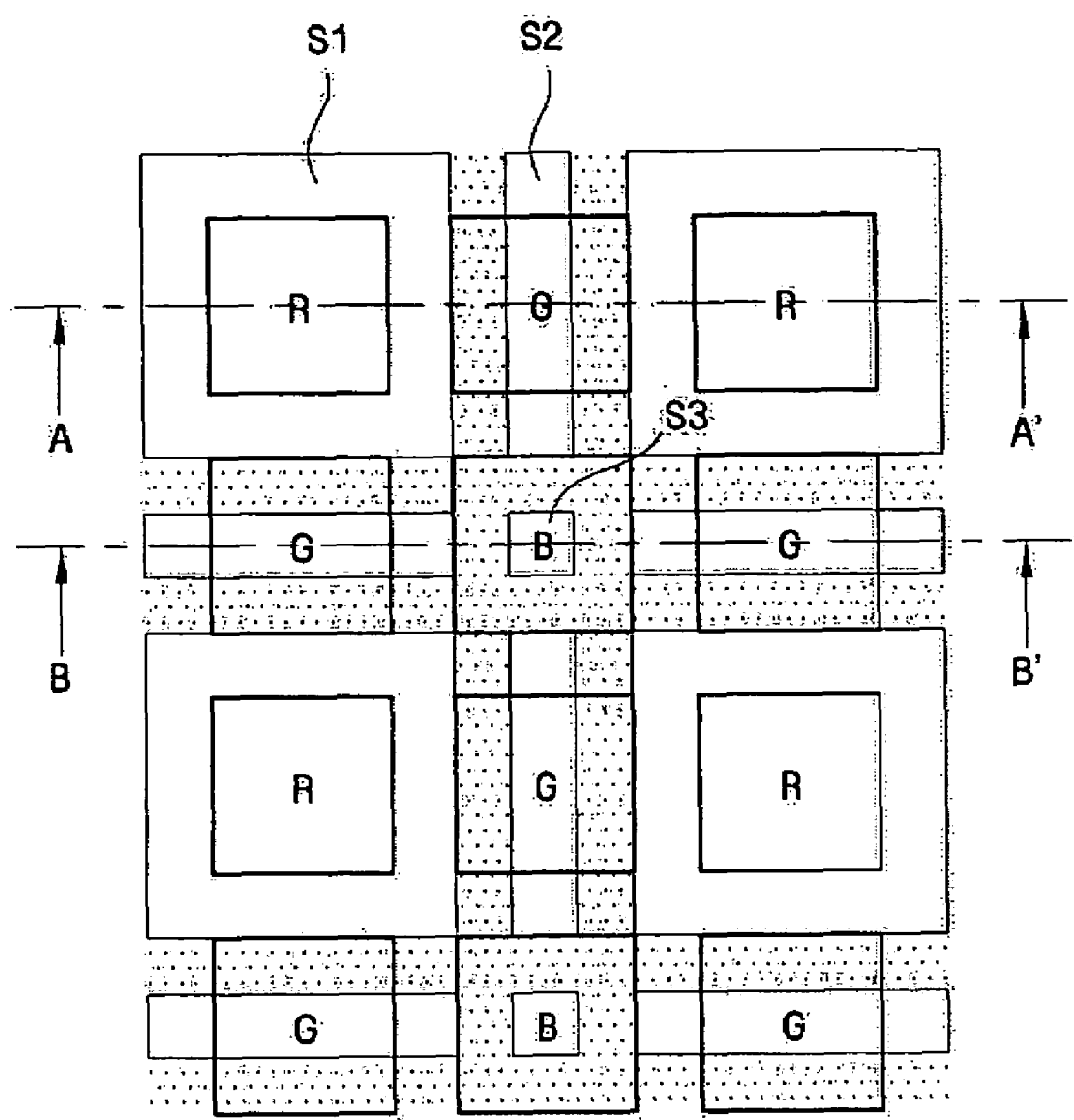
FIG. 7 is a layout illustrating the relationship between a photoelectric converter of a unit pixel and a second isolation well in an image sensor, according to an exemplary embodiment of the present invention.
Figure 8A:
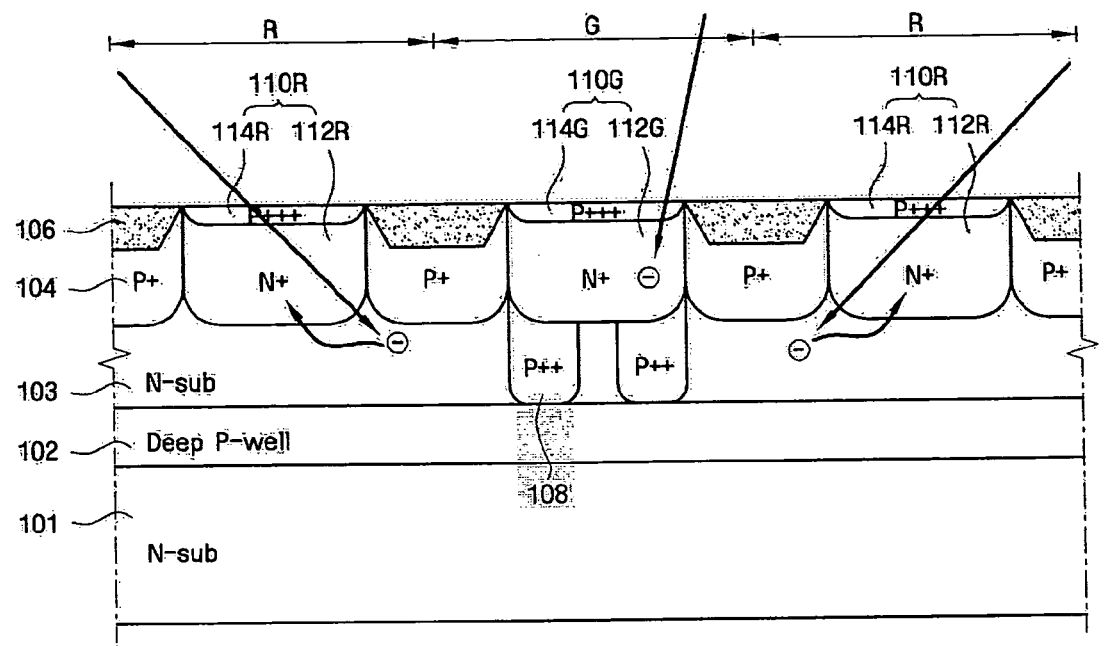
FIG. 8A is a cross-section of the image sensor, taken along the line A-A' shown in FIG. 7.
Figure 8B:
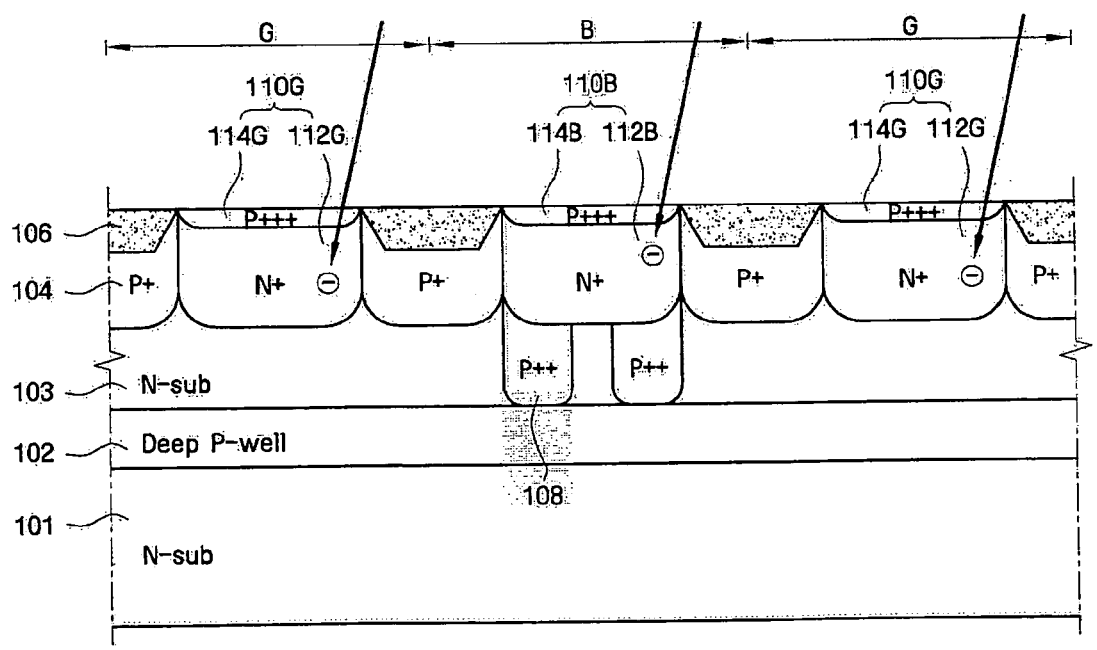
FIG. 8B is a cross-section of the image sensor, taken along the line B-B' shown in FIG. 7.

FIG. 7 is a layout illustrating the relationship between a photoelectric converter of a unit pixel and a second isolation well in an image sensor, according to another exemplary embodiment of the present invention, FIG. 8A is a cross-section of the image sensor, taken along the line A-A' shown in FIG. 7, and FIG. 8B is a cross-section of the image sensor, taken along the line B-B' shown in FIG. 7.

An image sensor according to the exemplary embodiment illustrated in FIGS. 7 through 8B is different from that according to the exemplary embodiments illustrated in FIGS. 4 through 5B in that the second isolation well 108 is formed in a minimum area to maximize an area of the photoelectric converters 110R, 110G, and 110B. In other words, the upper substrate area 103 is formed in predetermined areas S2 and S3 under the photodiodes 112G and 112B, respectively, included in the green and blue photoelectric converters 110G and 110B, respectively. In particular, since a wavelength decreases in order of red, green, and blue, areas of the upper substrate area 103 under the respective photodiodes 112R, 112G, and 112B may be determined to decrease in order of red, green, and blue (i.e., S1≧S2≧S3). Accordingly, as shown in FIG. 7, the upper substrate area 103 may be formed under the red photodiode 112R in the same manner as the upper substrate area 103 is formed in the exemplary embodiment illustrated in FIGS. 4 through 5B. Moreover, the upper substrate area 103 under the green photodiode 112G may be formed extending in one direction, and the upper substrate area 103 under the blue photodiode 112B may be formed overlapping with that under the green photodiode 112G. Since the green and blue photoelectric converters 110G and 110B includes the upper substrate area 103 under the photodiodes 112G and 112B, respectively, charges generated under the photodiodes 112G and 112B can be integrated at the photodiodes 112G and 112B.

Figure 9:
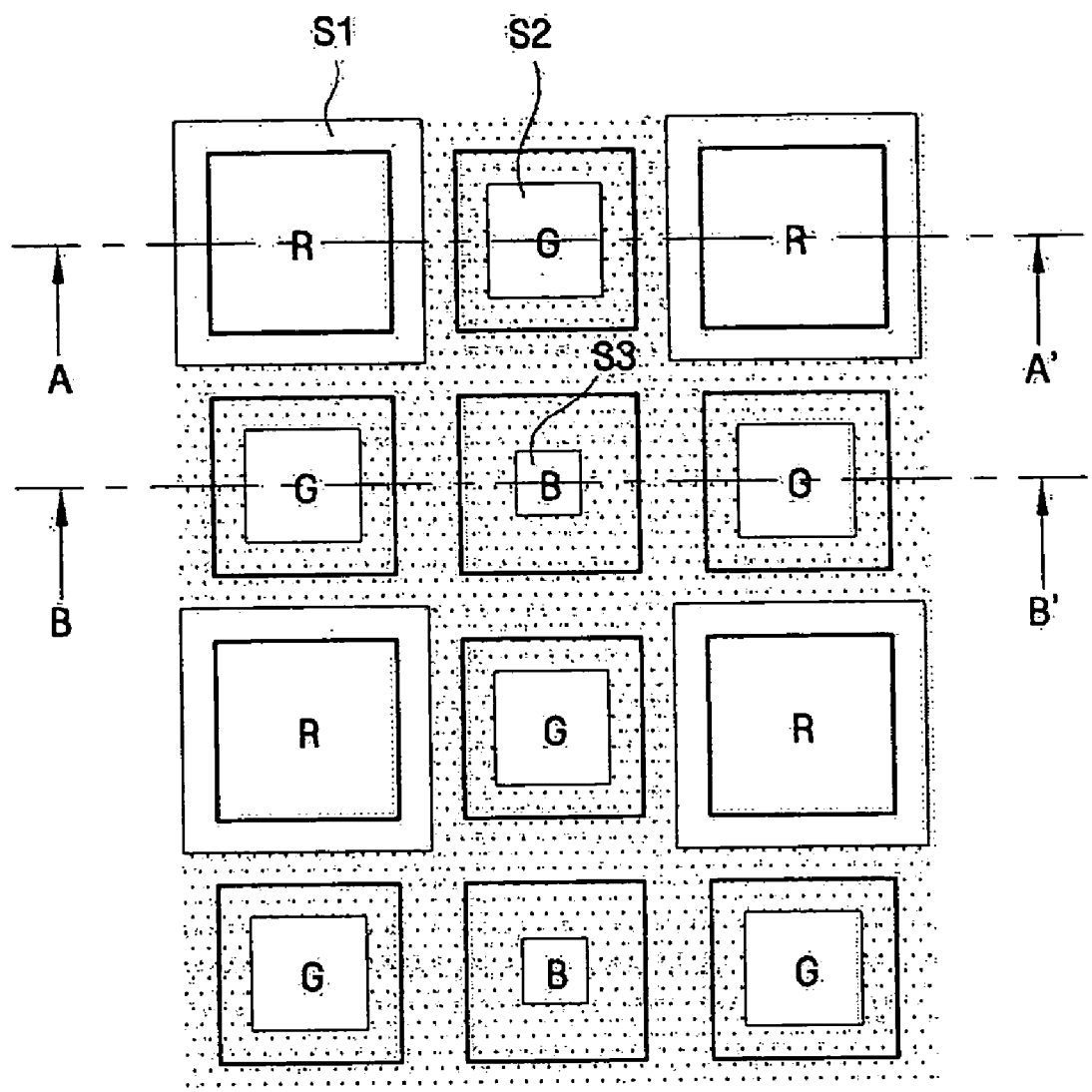
FIG. 9 is a layout illustrating the relationship between a photoelectric converter of a unit pixel and a second isolation well in an image sensor, according to an exemplary embodiment of the present invention.
Figure 10A:
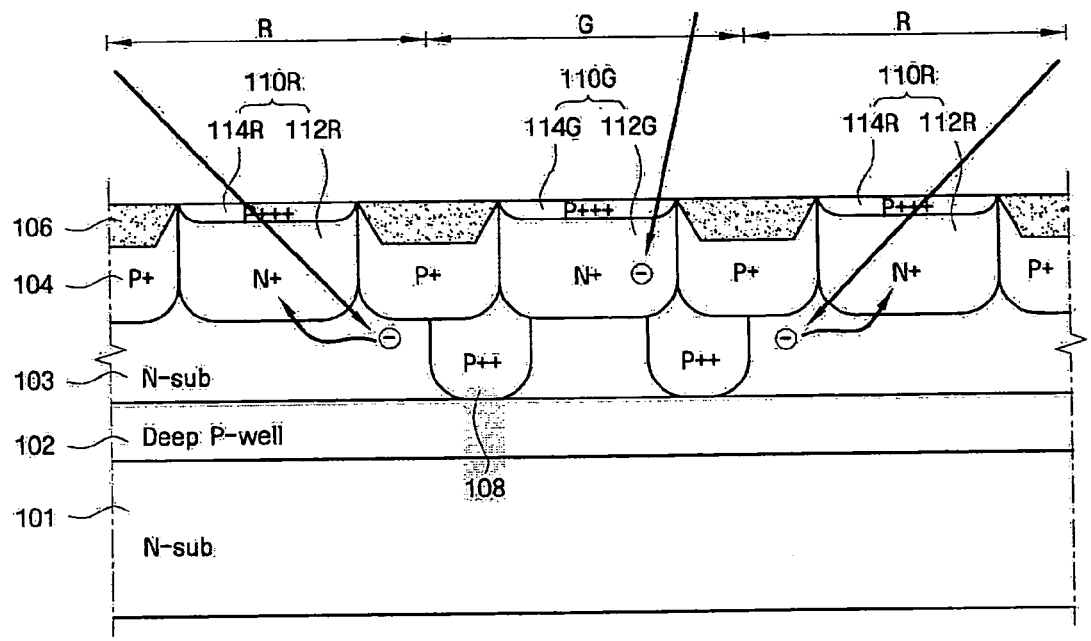
FIG. 10A is a cross-section of the image sensor, taken along the line A-A' shown in FIG. 9.

FIG. 9 is a layout illustrating the relationship between a photoelectric converter of a unit pixel and a second isolation well in an image sensor, according to still another exemplary embodiment of the present invention. FIG. 10A is a cross-section of the image sensor, taken along the line A-A' shown in FIG. 9, and FIG. 10B is a cross-section of the image sensor, taken along the line B-B' shown in FIG. 9.

Figure 10B:
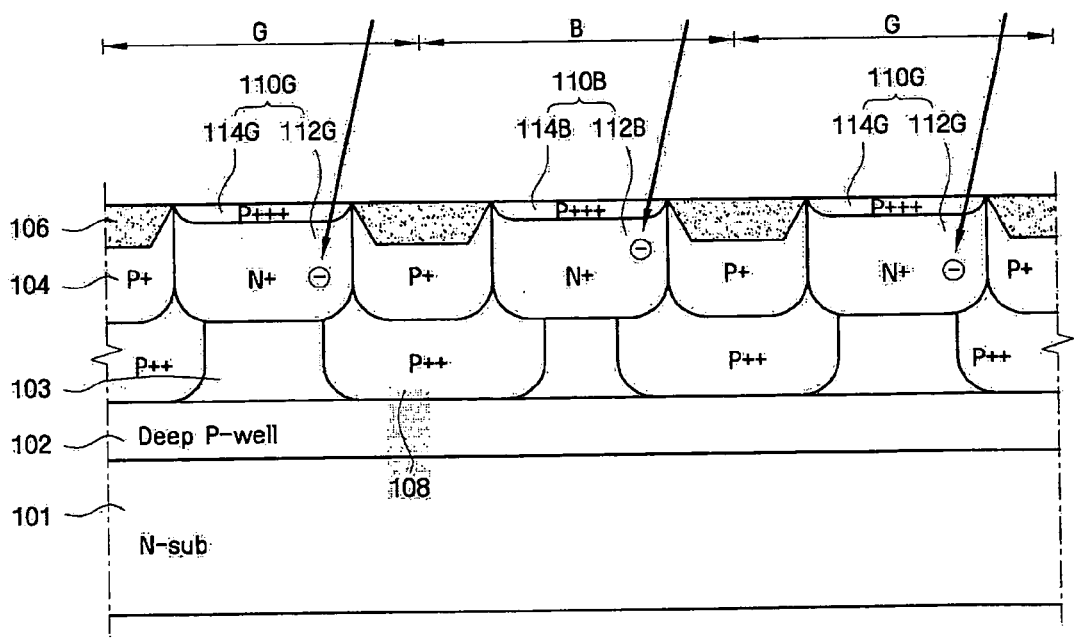
FIG. 10B is a cross-section of the image sensor, taken along the line B-B' shown in FIG. 9.

In an image sensor according to the exemplary embodiment illustrated in FIGS. 9 through 10B, the photoelectric converters 110R, 110G, and 110B include the upper substrate area 103 in predetermined areas under their respective photodiodes 112R, 112G, and 112B. Since a wavelength decreases in order of red, green, and blue, the areas of the upper substrate area 103 under the respective photodiodes 112R, 112G, and 112B may be determined to decrease in order of red, green, and blue (i.e., S1≧S2≧S3). In particular, since photoelectric conversion is performed on a short wavelength in a blue wavelength, the second isolation well 108 may be formed entirely under the blue photodiode 112B without having the upper substrate area 103 under the blue photodiode 112B.

According to the exemplary embodiments of the present invention, an image sensor can reduce electrical crosstalk that may occur due to a long wavelength. Accordingly, image distortion, poor tint, a blooming effect, etc. can be reduced and thus the image reproducibility characteristics are also improved by the exemplary embodiments of the present invention. In addition, since charges generated due to the long wavelength can be integrated at a photodiode area, color sensitivity can also be increased.

Hereinafter, a method of fabricating an image sensor according to an exemplary embodiment of the present invention will be described with reference to FIGS. 11A through 11D. FIGS. 11 through 11D are cross-sections of stages in a method of fabricating an image sensor, according to an exemplary embodiment of the present invention.

Figure 11A:
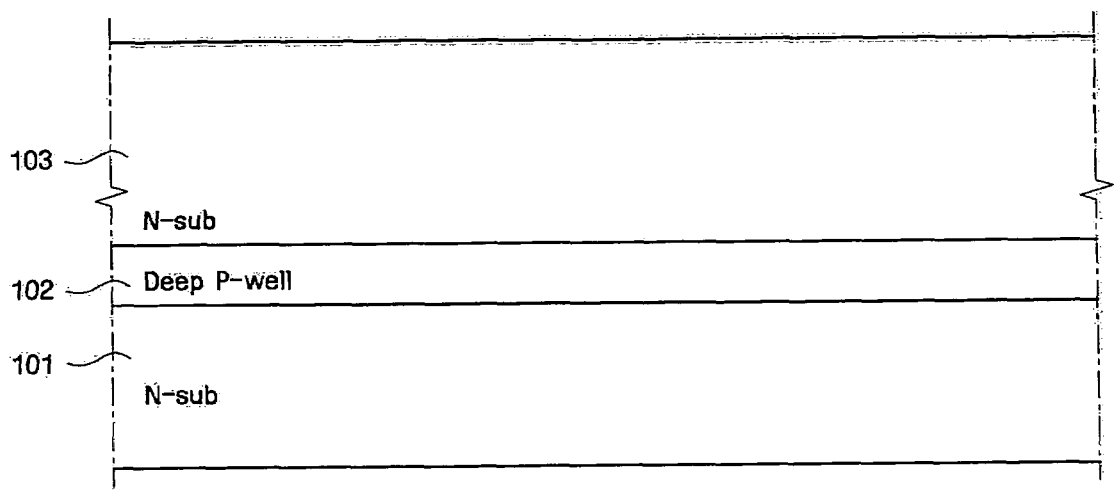
FIGS. 11 through 11D are cross-sections of stages in a method of fabricating an image sensor, according to an exemplary embodiment of the present invention.

Referring to FIG. 11A, impurity ions are implanted into a predetermined area in a first conductivity type semiconductor substrate, thereby forming a deep well 102 defining a lower substrate area 101 and an upper substrate area 103. For example, when an N type semiconductor substrate is used, boron ions having a second conductivity type different than the semiconductor substrate may be implanted at an energy of at least about 2 MeV and a dose of about $1\times10^{11}$ through about $1\times10^{16}$ ions/cm$^2$ to form the deep well 102. The deep well 102 may be formed at a depth of about 3-12 μm from a surface of the semiconductor substrate and have a maximum concentration of about $1\times10^{15}$ through about $1\times10^{20}$ atoms/cm$^3$.

Figure 11B:
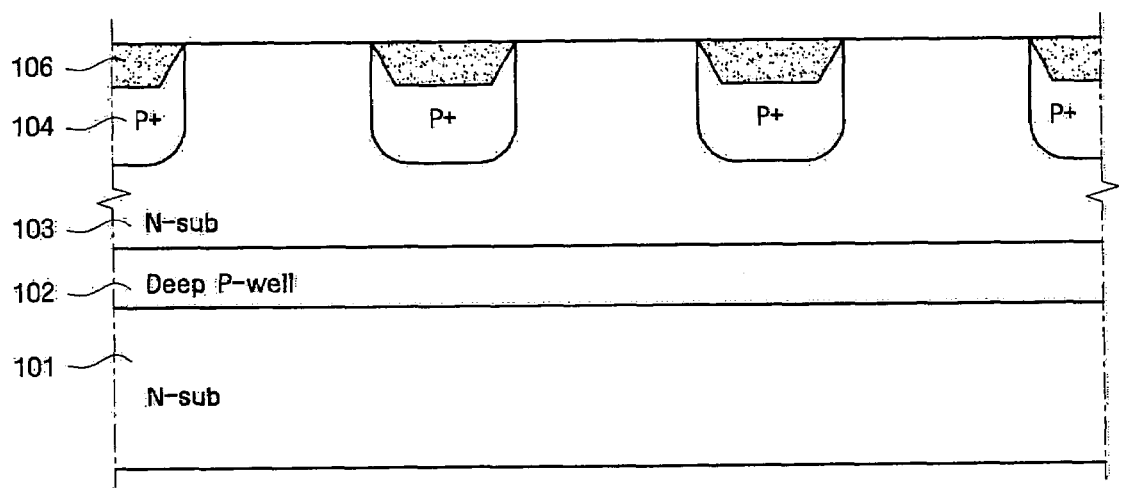

Referring to FIG. 11B, a device isolation region 106 is formed on the upper substrate area 103 to define active regions for pixels and peripheral circuits to be formed.

Thereafter, impurity ions are implanted under the device isolation region 106, thereby forming a first isolation well 104 having the second conductivity type to reduce horizontal crosstalk. Here, the first isolation well 104 may have an impurity concentration of about $1\times10^{16}$ through about $1\times10^{18}$ atoms/cm$^3$ and may extend to substantially the same depth as or deeper than a photodiode.

Figure 11C:
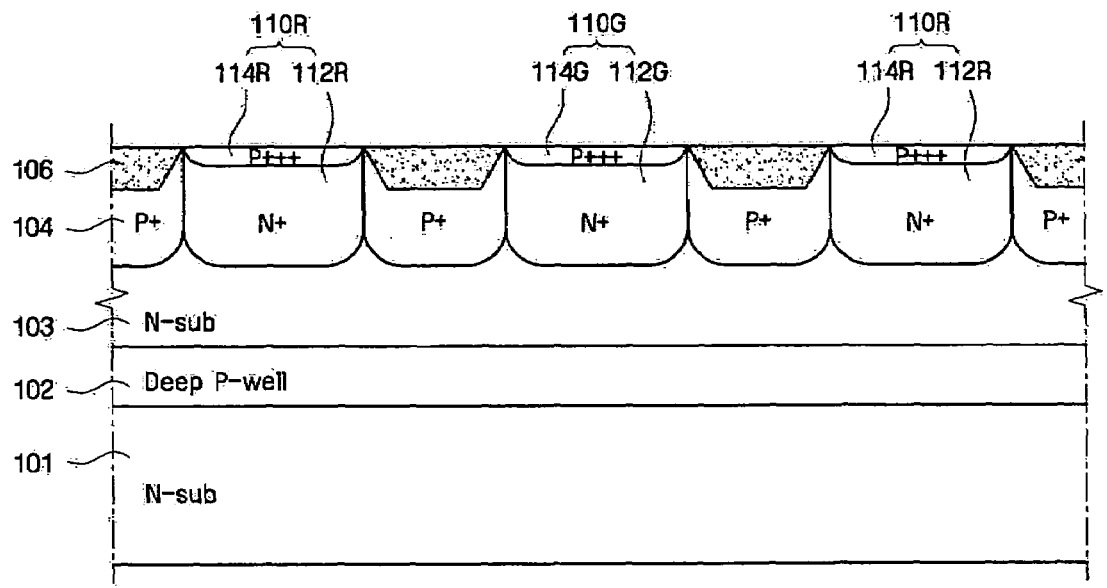
Figure 11D:
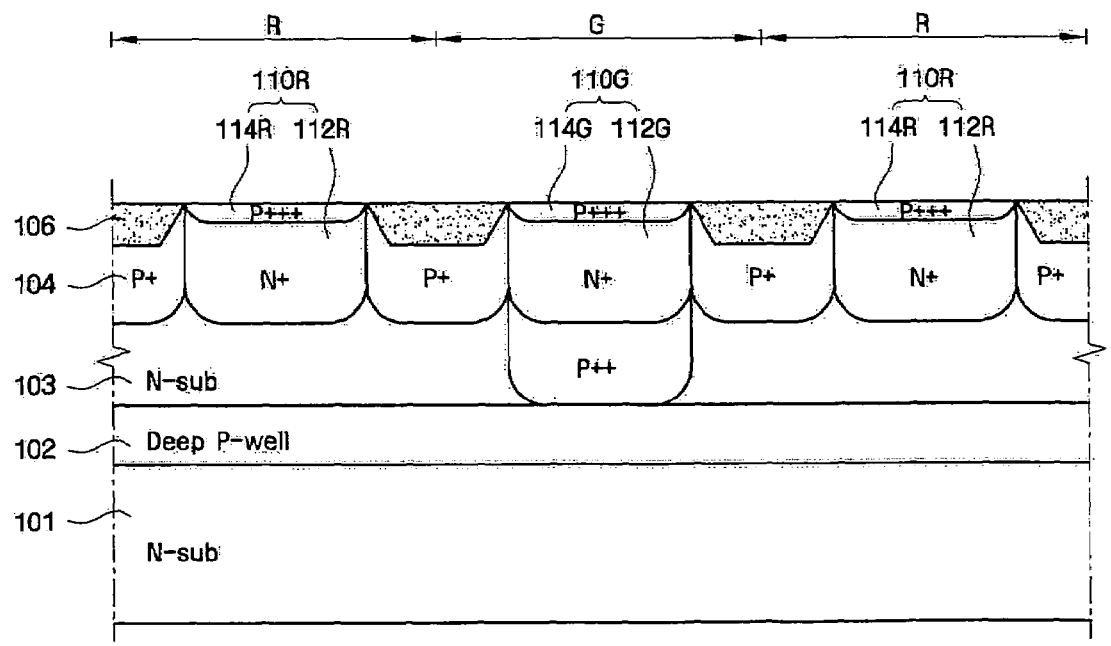

Referring to FIG. 11C, impurity ions are implanted in the active regions, thereby forming photodiodes 112R, 112G, and 112B and pinning layers 114R, 114G, and 114B. The photodiodes 112R, 112G, and 112B and the pinning layers 114R, 114G, and 114B are formed using two different ion-implantation processes. In detail, first conductivity type impurity ions are implanted deeper than surrounding source and drain to form the photodiodes 112R, 112G, and 112B, and then second conductivity type impurity ions are implanted onto the top of the photodiodes 112R, 112G, and 112B at lower energy and high dose to form the pinning layers 114R, 114G, and 114B near the surface of the semiconductor substrate. The photodiodes 112R, 112G, and 112B are formed separated from the deep well 102 by a predetermined distance. The photodiodes 112R, 112G, and 112B may have an impurity concentration of about $1\times10^{15}$ through about $1\times10^{18}$ atoms/cm$^3$ and the pinning layers 114R, 114G, and 114B may have an impurity concentration of about $1\times10^{18}$ through about $1\times10^{22}$ atoms/cm$^3$. Here, a doping concentration and position may be different according to fabrication processes and design.

Referring to FIG. 11D, a second isolation well 108 is formed to divide the upper substrate area 103 under the photodiodes 112R, 112G, and 112B in units of unit pixels such that the upper substrate area 103 has different areas under the photodiodes 112R, 112G, and 112B according to the wavelength of incident light. The second isolation well 108 is formed by implanting second conductivity type impurity ions into the resultant structure shown in FIG. 11C at an energy of about 1-3 MeV and a dose of about $1\times10^{12}$ through about $1\times10^{15}$ ions/cm$^2$. Even when high energy is used for ion-implantation, a simple photoresist pattern, as shown in FIG. 4, is used, thereby facilitating fabrication.

In this exemplary embodiment of the present invention, the deep well 102, the first isolation well 104, the photodiodes 112R, 112G, and 112B, and the pinning layers 114R, 114G, and 114B are sequentially formed. However, other forming sequences known to those skilled in the art may also used in practicing the exemplary embodiments of the present invention.

In another embodiment of the present invention, the deep well 102 may be formed deeper and the second isolation well 108 may be formed using a plurality of ion-implantations to divide the upper substrate area 103 under the photodiodes 112R, 112G, and 112B. For example, ion-implantations may be performed at energy of 3, 2, and 2 MeV sequentially, so that the second isolation well 108 extends deeper.

The exemplary embodiments of the present invention will be described in more detail by explaining the following exemplary embodiment experiment. Details that can be technologically inferred from the following description will be omitted.

Exemplary Embodiment Experiment

A P type deep well was formed in an N type semiconductor substrate, thereby defining a lower substrate area under the P type deep well and an upper substrate area over the P type deep well. A plurality of PPDs were formed within the upper substrate area to be separated from the P type deep well by a predetermined distance. Thereafter, a second isolation well was formed to divide the upper substrate area under the PPDs, as shown in FIG. 4. Thereafter, a spectral response characteristic of a color image sensor was measured at different wavelengths. Measuring results are illustrated in FIG. 12.

Figure 12:
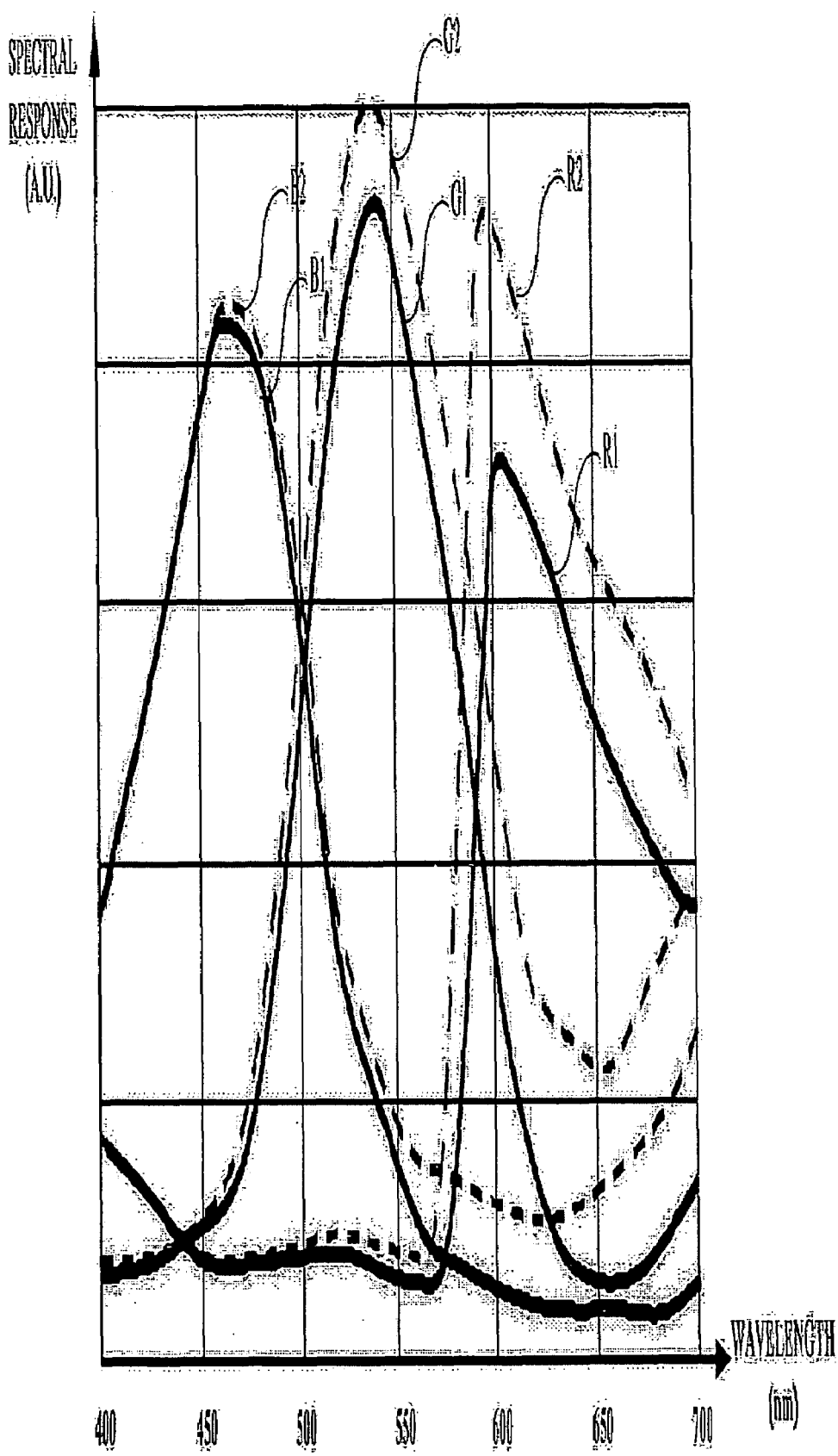
FIG. 12 is a graph illustrating spectral response characteristics measured from a color image sensor fabricated according to an exemplary embodiment of the present invention.

In FIG. 12, an x-axis indicates a wavelength and a y-axis indicates spectral response. Solid lines refer to the exemplary experiment of the present invention and dotted lines refer to conventional technology. Here, a standardized value is used for the spectral response. In the conventional technology, crosstalk increases when a wavelength increases, spectral characteristics of regions other than a relevant region appear. For example, at a wavelength of about at least 600 nm, it is expected that only an output of red pixels appears and outputs of green and blue pixels almost do not appear. However, in the conventional technology, at the wavelength of about at least 600 nm, outputs G2 and B2 of the green and blue pixels are great although an output R2 of red pixels appears high. As a result, color purity decreases due to crosstalk. However, in the exemplary embodiment experiment of the present invention, at the wavelength of about at least 600 nm, an output R1 of red pixels mainly appears and outputs G1 and B1 of green and blue pixels are very small. Accordingly, it can be inferred that the exemplary embodiments of the present invention reduce crosstalk.

As described above, according to exemplary embodiments of the present invention, one or more of the following effects are achieved. Electrical crosstalk that may occur due to a long wavelength is reduced. Accordingly, image distortion, poor tint, and a blooming effect are reduced, and therefore, image reproducibility is increased. In addition, since charges generated due to the long wavelength can be integrated at a photodiode area, sensitivity due to the long wavelength increases. Moreover, since a second isolation well is formed using a simple photoresist pattern, ion-implantation using high energy can be used without restrictions.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. An image sensor comprising:
a semiconductor substrate having a first conductivity type;
a deep well having a second conductivity type, the deep well being formed at a predetermined depth in the semiconductor substrate to divide the semiconductor substrate into a first conductivity type upper substrate area and a lower substrate area; and
a plurality of unit pixels integrating charges corresponding to incident light and comprising first conductivity type ion-implantation areas said first conductivity type ion-implantation areas are separated from one another, at least one unit pixel among the plurality of unit pixels further comprising the first conductivity type upper substrate area that is positioned under a first conductivity type ion-implantation area included in the unit pixel, extends beyond the first conductivity type ion-implantation area and is electrically isolated from first conductivity type ion-implantation areas included in adjacent unit pixels of said plurality of unit pixels, wherein the first conductivity type ion-implantation areas are defined by a second conductivity type first isolation well and wherein the first isolation well extends to at least substantially the same depth as or deeper than the ion implantation areas, wherein the first conductivity type upper substrate area included in the at least one unit pixel is wider than the first conductivity type upper substrate area included in each of the unit pixels other than the at least one unit pixel among the plurality of unit pixels.

2. The image sensor of claim 1, wherein the at least one unit pixel integrates charges corresponding to incident light having a longest wavelength of incident light into the plurality of unit pixels.

3. The image sensor of claim 1, wherein the plurality of unit pixels comprise a red unit pixel, a green unit pixel, and a blue unit pixel which integrate charges corresponding to incident light having a wavelength in a red region, incident light having a wavelength in a green region, and incident light having a wavelength in a blue region, and wherein the at least one unit pixel is the red unit pixel.

4. The image sensor of claim 3, wherein each of the green and blue unit pixels comprises only a first conductivity type ion-implantation area.

5. The image sensor of claim 3, wherein the first conductivity type upper substrate area included in the red unit pixel is wider than the first conductivity upper substrate included in each of the green and blue unit pixels.

6. The image sensor of claim 5, wherein the first conductivity type upper substrate area included in the green unit pixel is wider than the first conductivity type upper substrate area included in the blue unit pixel.

7. The image sensor of claim 3, wherein the red, green, and blue unit pixels are arranged in a Bayer type color filter array.

8. The image sensor of claim 1, wherein the first conductivity type ion-implantation areas of the unit pixels are isolated from each other by a second isolation well having the second conductivity type.

9. The image sensor of claim 8, wherein the second isolation well having the second conductivity type has substantially the same depth as or is deeper than the first conductivity type ion-implantation areas.

10. The image sensor of claim 8, wherein the first conductivity type upper substrate area at least partially overlaps with the second isolation well.

11. The image sensor of claim 8, wherein the second isolation well having the second conductivity type divides the upper substrate area under the first conductivity type ion-implantation areas such that at least one unit pixel among the plurality of unit pixels includes the first conductivity type upper substrate area positioned under a first conductivity type ion-implantation area included in the unit pixel.

12. An image sensor comprising:
a semiconductor substrate having a first conductivity type;
a deep well having a second conductivity type, the deep well being formed at a predetermined depth in the semiconductor substrate to divide the semiconductor substrate into a first conductivity type upper substrate area and a lower substrate area;
a plurality of unit pixels integrating charges corresponding to incident light and comprising first conductivity type ion-implantation areas said first conductivity type ion-implantation areas are separated from one another; and
a second isolation well having the second conductivity type which divides the upper substrate area under the first conductivity type ion-implantation areas such that at least one unit pixel among the plurality of unit pixels includes the first conductivity type upper substrate area positioned under a first conductivity type ion-implantation area included in the unit pixel, wherein the first conductivity type upper substrate area included in the at least one unit pixel extends beyond the first conductivity type ion-implantation area and is electrically isolated from first conductivity type ion-implantation areas included in adjacent unit pixels of said plurality of unit pixels.

13. The image sensor of claim 12, wherein the first conductivity type ion-implantation areas are defined by a second conductivity type first isolation well and wherein the first isolation well extends to at least substantially the same depth as or deeper than the ion implantation areas.

14. The image sensor of claim 1, wherein the first conductivity type upper substrate area is not included in the unit pixels other than the at least one unit pixel among the plurality of unit pixels.

* * * * *